(12) United States Patent
Hsuan et al.

(10) Patent No.: US 8,546,739 B2
(45) Date of Patent: Oct. 1, 2013

(54) MANUFACTURING METHOD OF WAFER LEVEL CHIP SCALE PACKAGE OF IMAGE-SENSING MODULE

(76) Inventors: Min-Chih Hsuan, Hinchu (TW); Tsung-Hsi Ko, Hsinchu (TW); Li-Che Chen, Pintung County (TW)

(*) Notice: Subject to any disclaimer, the term of this patent is extended or adjusted under 35 U.S.C. 154(b) by 606 days.

(21) Appl. No.: 12/541,153

(22) Filed: Aug. 13, 2009

(65) Prior Publication Data

US 2009/0305451 A1 Dec. 10, 2009

Related U.S. Application Data

(63) Continuation-in-part of application No. 11/693,743, filed on Mar. 30, 2007, now Pat. No. 7,659,501.

(51) Int. Cl.
*H01J 3/14* (2006.01)
*H01J 5/16* (2006.01)

(52) U.S. Cl.
USPC ......... 250/216; 250/208.1; 257/431; 257/432

(58) Field of Classification Search
USPC ............... 250/208.1, 214.1, 214 R, 216, 226; 359/619–626; 257/65, 294, 431, 432, 439
See application file for complete search history.

(56) References Cited

U.S. PATENT DOCUMENTS

| | | | |
|---|---|---|---|
| 6,822,803 B2 | 11/2004 | Muto et al. | |
| 6,891,592 B2 | 5/2005 | Magana et al. | |
| 2003/0021034 A1* | 1/2003 | Yoshikawa et al. | 359/619 |
| 2004/0166763 A1* | 8/2004 | Hanada et al. | 445/51 |
| 2006/0132644 A1* | 6/2006 | Shangguan et al. | 348/374 |
| 2007/0090275 A1* | 4/2007 | Toyoda et al. | 250/208.1 |
| 2008/0006859 A1* | 1/2008 | Mionetto | 257/294 |
| 2008/0118241 A1* | 5/2008 | TeKolste et al. | 396/439 |

* cited by examiner

*Primary Examiner* — Francis M Legasse, Jr.
(74) *Attorney, Agent, or Firm* — WPAT, PC; Justin King

(57) ABSTRACT

A manufacturing method of a wafer level chip scale package of an image-sensing module is provided. The method includes providing a wafer having a plurality of die regions, and a plurality of sensing units is formed on a surface of the wafer in each die region. A plurality of lens units is formed on the sensing units, wherein each lens unit includes a lens and an edge wall that are integrally formed. A light-shielding film is also formed on a surface of at least one edge wall of at least one lens units. A dicing process is then performed on the wafer to form a plurality of image sensor chips.

15 Claims, 3 Drawing Sheets

MANUFACTURING METHOD OF WAFER LEVEL CHIP SCALE PACKAGE OF IMAGE-SENSING MODULE

CROSS-REFERENCE TO RELATED APPLICATION

This is a continuation-in-part application of patent application Ser. No. 11/693,743 filed on Mar. 30, 2007, now pending. The entirety of the above-mentioned patent application is hereby incorporated by reference herein and made a part of this specification.

BACKGROUND OF THE INVENTION

1. Field of the Invention

The present invention relates to a manufacturing method of an image-sensing module, and more particularly, to a manufacturing method of a wafer level chip scale package of an image-sensing module.

2. Description of Related Art

The process of fabricating complementary metal-oxide-semiconductor (CMOS) image sensor and CMOS transistor are compatible. Therefore, image sensors along with other peripheral circuits can be easily integrated on the same chip to reduce overall production cost and power consumption. In recent years, CMOS image sensors are widely adopted in low-end applications and frequently serve as a replacement for charge-coupled devices. Consequently, the importance of CMOS image sensors is increasing every day.

FIG. 1A is a schematic diagram of a conventional CMOS image sensor, and FIG. 1B is an explosion view showing the components of the CMOS image sensor in FIG. 1A. As shown in FIGS. 1A and 1B, the conventional CMOS image sensor 100 includes a base 110, a CMOS chip 120 and a lens group 130. The CMOS chip 120 and the lens group 130 is disposed on the base 110 and the lens group 130 covers the CMOS chip 120. The lens group 130 includes a lens mount 132, a plurality of lenses 134, an infrared filter 136 and a lens barrel 138. The lens mount 132 is fixed on the base 110 and the lenses 134 are disposed inside the lens barrel 138. The lens barrel 138 is fixed on the base 110 and the infrared filter 136 is disposed between the lenses 134 and the bottom of the base 110.

The lens barrel 138 has a pinhole 139 so that light rays from the exterior can pass through the pinhole 139 to reach the lens group 130. The lenses 134 focus the light rays onto a sensing area 122 of the CMOS chip 120 and the CMOS chip 120 detects the light falling on it. The infrared filter 136 filters the infrared portion of the incoming light rays to prevent the CMOS chip 120 from overheating. Hence, the life of the CMOS chip 120 is increased.

In the conventional technique, the lens group 130 includes a large number of components so that the material cost is high and the assembling time is long. As a result, the conventional CMOS image-sensing module 100 not only has a high production cost but is also too bulky to use in small electronic products such as a cell phone or a pinhole camera.

SUMMARY OF THE INVENTION

Accordingly, the present invention is to provide a method of manufacturing a wafer level chip scale package of an image-sensing module, wherein the productivity the image-sensing module is enhanced, while the overall production cost is reduced.

In accordance with an aspect of the invention, as embodied and broadly described herein, the invention provides a manufacturing method of a wafer level chip scale package of an image-sensing module. A wafer having a plurality of die regions is provided, wherein each die region comprises at least a sensing area, and a plurality of sensing units is formed in the sensing area. A focusing unit is then formed over the plurality of sensing units in the die region. The focusing unit includes a plurality of lens units stacked together, wherein each lens unit is formed with a lens and an edge wall at the periphery of the lens, and the lens and the edge wall are integrally formed. Thereafter, a singulation process is performed on the wafer the form a plurality of image sensor chips.

In one aspect of the present invention, a light-shielding film is formed on at least one surface of the edge walls of at least one lens unit of the plurality of lens units.

In one aspect of the present invention, the light-shielding film is formed on the top surface or the bottom surface or both the top and the bottom surfaces of the edge wall of at least one lens unit of the plurality of lens units.

In one aspect of the present invention, the light-shielding is formed with a material that includes metal or a light-blocking glue material.

In one aspect of the present invention, a plurality of micro lens is formed correspondingly on the plurality of the sensing units, and the focusing unit is formed over the plurality of micro lens.

In one aspect of the present invention, a cap layer having a pinhole is formed on the focusing unit subsequent to the step of performing singulation process.

In one aspect of the present invention, the top surface or the bottom surface or both the top and bottom surfaces of the lens are curved surfaces.

In one aspect of the present invention, the top surface or the bottom surface of the lens is a flat surface.

In one aspect of the present invention, the plurality of lens units are formed with glass or plastic.

In one aspect of the present invention, the plurality of lens units are securely stacked together through the application of glue in between the lens units or by thermal setting.

In one aspect of the present invention, the lenses of the lens units have different refractive indexes.

Accordingly, the focusing unit in the present invention has a simple structure, occupies a small volume and costs less to produce. Therefore, the design is able to reduce the volume of the image-sensing module and lower its overall production cost. In addition, the focusing unit of the image-sensing module is directly formed on the wafer. Hence, the assembling time is saved so that the productivity is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
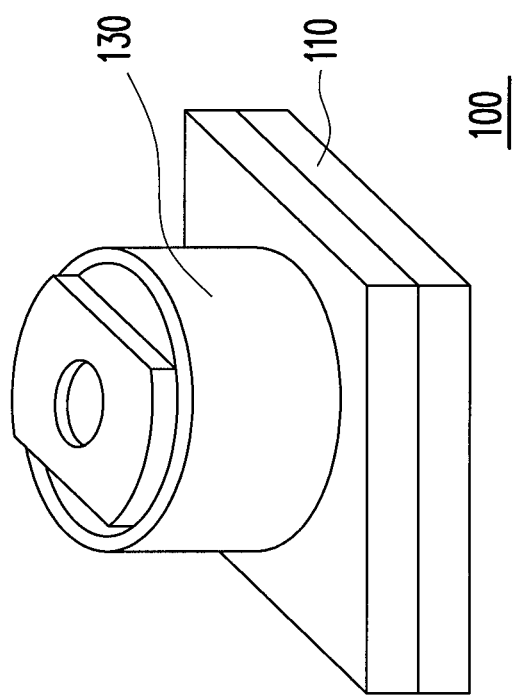
FIG. 1A is a schematic diagram of a conventional CMOS image sensor.
Figure 1B:
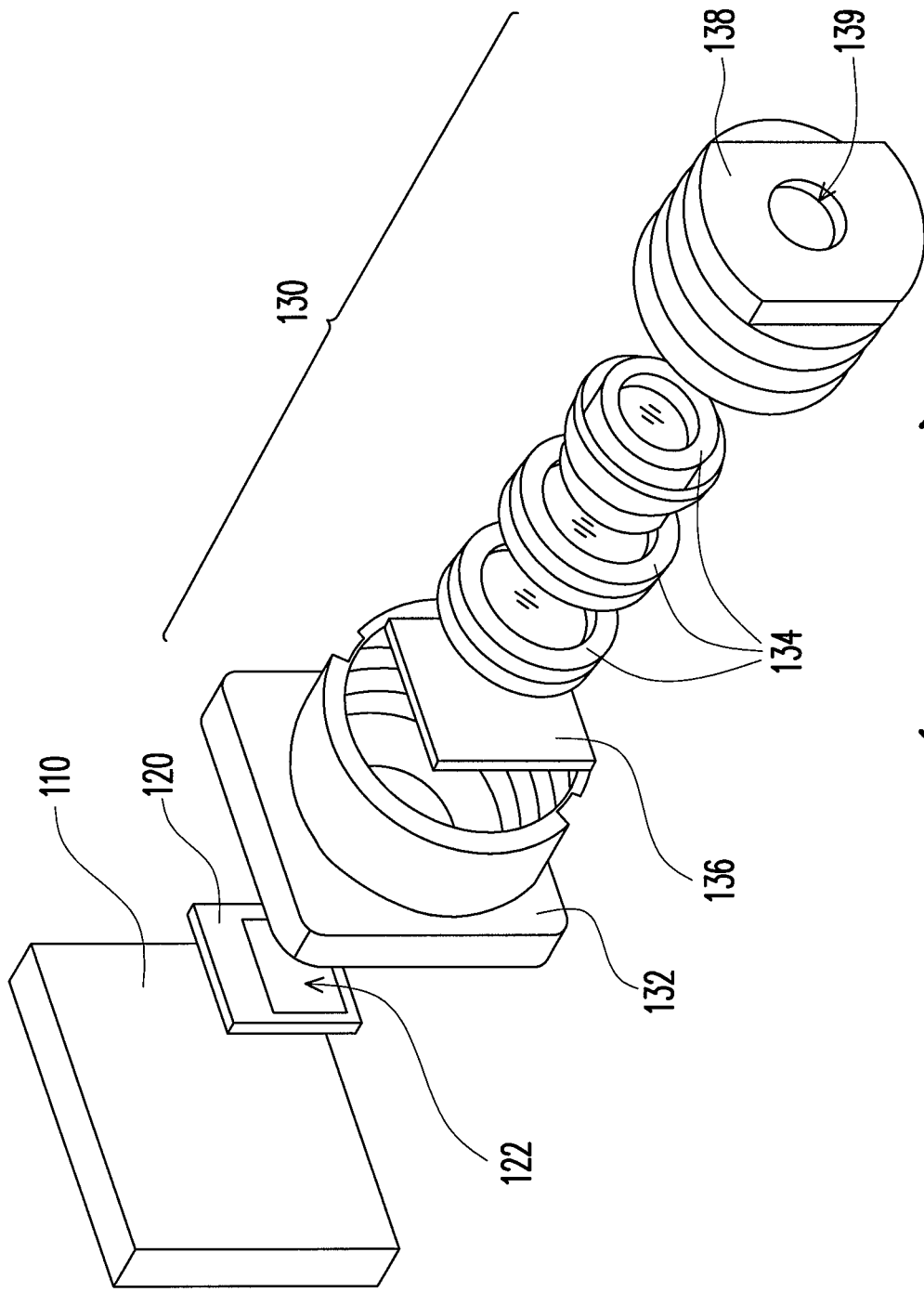
FIG. 1B is an explosion view showing the components of the CMOS image sensor in FIG. 1A.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
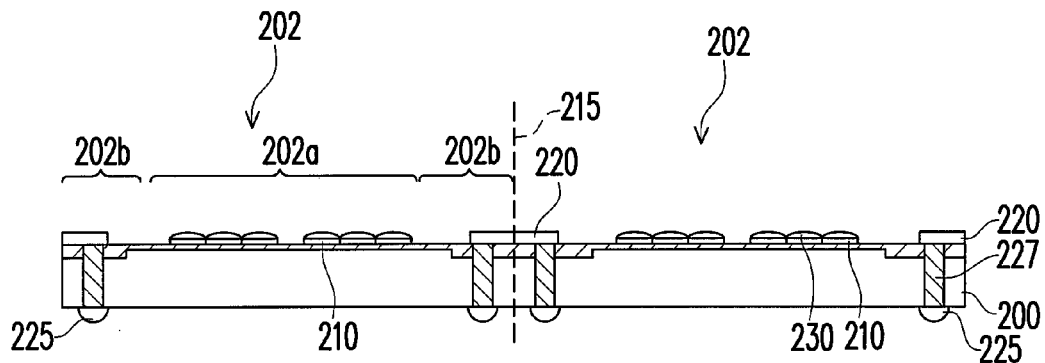
FIGS. 2A to 2C is are schematic cross-sectional views illustrating a method for manufacturing a wafer level chip scale package of an image-sensing module according to one exemplary embodiment of the present invention.
Figure 2B:
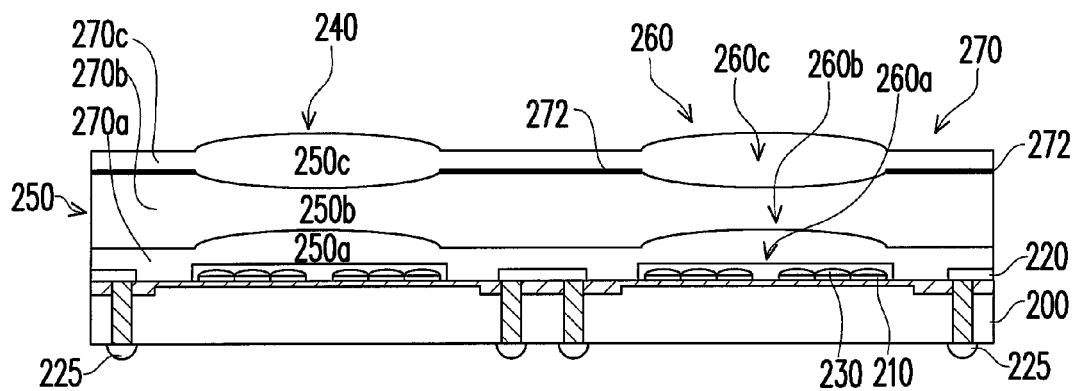
Figure 2C:
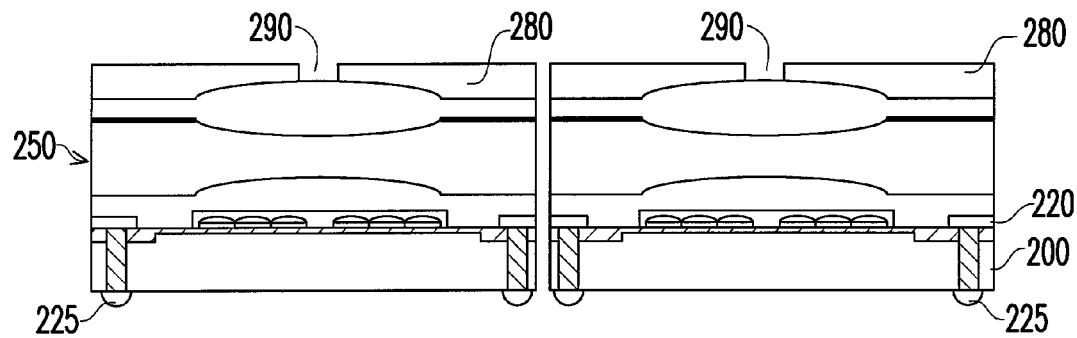

FIGS. 2A to 2C are schematic cross-sectional views illustrating a method for manufacturing a wafer level chip scale package of an image-sensing module according to one exemplary embodiment of the present invention. As shown in FIG. 2A, a wafer 200 includes a plurality of die regions 202 is provided. The top surface of the wafer 200 of each die region 202 includes a sensing area 202a and a peripheral area 202b connected to the sensing area 202a. A plurality of image sensing units 210 is formed on the top surface of the wafer 200 inside the sensing area 202a of each die region 202. The sensing units 210 include, but not limited to, CMOS image sensors. A plurality of bonding pads 220 are formed around the scribe line 215 in the peripheral area 202b, wherein the bonding pads 220 are connected to the solder balls 225 at the lower surface of the chip, for example, through the through-silicon vias (TSV) 227 formed in the wafer 200. The bonding pads 220 are electrically connected with the devices of other electronic products through solder balls 225. The scribe line 215 is used as a cutting line in a subsequent dicing process for dividing the wafer into a plurality of image sensor chips after completing the manufacturing process of the wafer-level chip package. According to one aspect of the invention, a plurality of micro lens 230 is correspondingly formed on the plurality of image sensing units 210.

Thereafter, referring to FIG. 2B, a focusing unit 240 is formed over the image sensing units 210 in each die region 202. The focusing unit 240 includes at least one lens unit 250, and each lens unit 250 includes a lens 260 and an edge wall 270 at the periphery of the lens 260. The lens 260 and the edge wall 270 are integrally formed as the lens unit 250. Each lens unit 250 is pre-fabricated to have a particular shape, curvature, thickness, and configuration. Then, the lens units 250 are stacked together one-by-one. The material of the lens units 250 includes, but not limited to, plastic or glass. In this exemplary embodiment, as shown in FIG. 2B, the focusing unit 240 may include a first lens unit 250a, a second lens unit 250b and a third lens unit 250c, wherein the first lens unit 250a is disposed in the sensing area 202a, and the first lens 260a of the first lens unit 250a is positioned directly above the micro lens 230 and the image sensing unit 210. Then, the second lens unit 250b is disposed on the first lens unit 250a, and the third lens unit 250c is disposed on the second lens unit 250b. The lens units 250a, b, c are securely positioned together through the application of glue in between the lens units 250a, b, c when the lens units 250a, b, c are made of glass, for example, or by thermal setting when the lens units 250a, b, c are made with plastic, for example.

In this exemplary embodiment, the first lens unit 250a is fabricated with a particular configuration such that the lower surface, the surface facing the sensing units 210, of the first lens 260a of the first lens unit 250a is depressed inward, while the upper surface thereof, the surface opposite to the lower surface, is slightly protruded. The second lens unit 250b includes, for example, a double-concave lens 260b, wherein both the upper and lower surfaces are curved inward. Further, in this aspect of the invention, the contour of lower surface of the second lens unit 250b complements that of the upper surface of the first lens unit 250a. In other words, the contour of the low surface of the second lens unit 250b coincides or corresponds exactly with the contour of the upper surface of the first lens unit 250a. It should be appreciated that the contour of lower surface of the second lens unit 250b may or may not complement that of the upper surface of the first lens unit 250a in other aspects of the invention. The third lens unit 250c includes, for example, a double-convex lens 260c, wherein both the upper and lower surfaces are curved outward. Similarly, the contour of the lower surface of the third lens unit 250c may or may not complement that of the upper surface of the second lens unit 250b. In addition, these lenses 260a, 260b, 260c may have the same or different refractive indexes. The refractive indexes of the lenses 260a, 260b, 260c are, for example, between 1 to 2, preferably between 1.4 to 1.8.

Although the above exemplary embodiments refer to a focusing unit 140 having three lens units of certain shapes and curvatures, it is to be understood that the exemplary embodiments are presented by way of example and not by way of limitation. The intent of the description provided herein is to cover all modifications, alternatives, and equivalents as may fall within the spirit and scope of the invention as defined by the appended claims. For example, it is understood by a person of ordinary skill practicing this invention that anyone skilled in this art may adjust the curvature of the surface of the lens unit to be flat, convex or concave, choose the number of lenses to be used, for example, ranging from 1 to 5 lenses or more, and select the refractive indexes of the lenses so that the focusing unit in combination with the micro lenses can accurately direct the incoming light rays to the image-sensing unit.

Still referring to FIG. 2B, a light-shielding film 272 is formed on at least one surface of the edge wall 270 of the lens unit 250. The light-shielding film 272 may prevent strayed light rays from travelling to the image sensing unit to affect the sensing quality of the image-sensing module. In one aspect of the invention, the light-shielding film 272 is formed on the top surface of the edge wall 270b of the lens unit 250b. It should be noted that the application of one light-shielding film 272 on one surface of the lens unit 250b as shown in FIG. 2B is only illustrated as an exemplary example, and should not be adopted for limiting the scope of the present invention. It should be appreciated that the light-shielding film 272 may form on one on or both the top and the bottom surfaces of the edge wall 270 of one or more of the lens units 250. For example, in other aspects of the invention, the light-shielding film 272 is formed on both the top and the bottom surfaces of the edge wall 270a, c, b of the bottom-most lens unit 250a or the top-most lens unit 250c or one or more of the middle lens units 250b, or on just the top surface or just the bottom surface of one or more of the lens units 250, or on the top surface of one lens unit and on the bottom surface of another lens unit. A material of the light-shielding film 272 includes, but not limited to, metal or light-blocking glue. A material of the light-shielding film 272 includes, but not limited to, metal or light-blocking glue,. The light-blocking glue may be organic material glue or inorganic material glue. Examples of organic material glue include, but not limited to, silver glue, and examples of the inorganic material glue include, but not limited to, aluminium, titanium nitride, tantalum nitride.

Thereafter, as shown in FIG. 2C, a singulation process is performed to divide the wafer 200 into individual packages by using the scribe line 215 as the dicing line.

Still referring to FIG. 2C, a cap layer 280 is formed over the focusing unit 240 of each individual package of image sensing module. The top section of the cap layer 280 above the focusing unit 240 also includes a pinhole 290 for allowing the passage of external light rays to the focusing unit. After the formation of the cap layer 280, the individual package of an image sensing module is readily mounted onto a camera module.

In accordance to the present invention, the focusing unit is formed directly on the chip at wafer level. Hence, there is no need to assemble the focusing unit to the chip. As a result, the time for assembling the focusing unit is saved and the productivity is increased. In addition, the focusing unit has a simple structure, occupies a small volume and costs less to produce. Therefore, the design is able to reduce the volume of the image-sensing module and lower its overall production cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a wafer level chip scale package of an image-sensing module, the method comprising:
   providing a wafer that includes a plurality of die regions;
   forming a plurality of sensing units in each die region;
   forming at least one lens unit over the sensing units in the each die region, the at least one lens unit comprising a lens disposed in a sensing area and an edge wall disposed in a peripheral area next to the sensing area, where no lens is disposed, wherein the lens and the edge wall are of the same layer and the same material and a light-shielding film is formed on and in contact with a top surface or both the top and the bottom surfaces of the edge wall of the at least one lens unit; and
   performing a singulation process on the wafer with a cutting line passing through the edge wall to form a plurality of image sensor chips, wherein a cap layer is formed on the at least one lens unit subsequent to the step of the singulation process.

2. The method as claimed in claim 1, wherein the step of forming the at least one lens unit comprises forming two or more lens units stacked together.

3. The method as claimed in claim 1, wherein the light-shielding film is formed with a material comprising a metal or a light-blocking glue material.

4. The method as claimed in claim 1, wherein a top surface or a bottom surface or both the top and the bottom surfaces of the lens are curved surfaces.

5. The method as claimed in claim 1, wherein a top surface or a bottom surface of the lens is a flat surface.

6. The method as claimed in claim 1, wherein a plurality of micro lens is correspondingly formed on the plurality of image sensing units.

7. The method as claimed in claim 1, wherein the at least one lens unit is formed with a material comprising plastic or glass.

8. The method as claimed in claim 1, wherein the light-shielding film is formed only outside of the sensing area.

9. A manufacturing method of a wafer level chip scale package of an image-sensing module, the method comprising:
   providing a wafer that comprises a plurality of die regions, wherein each die region comprises at least a sensing area;
   forming a plurality of image sensing units in the each die region;
   forming a focusing unit over the image sensing units, the focusing unit comprising a plurality of lens units stacked together, wherein each lens unit comprises a lens disposed in the sensing area and an edge wall of the same layer and the same material as the lens, disposed in a peripheral area next to the sensing area, where no lens is disposed, wherein the edge wall comprises a light-shielding film on and in contact with a top surface or both the top and the bottom surfaces of the edge wall thereof; and
   dicing the wafer with a cutting line passing through the edge wall to form a plurality of image sensor chips after the step of forming the focusing unit, wherein a cap layer comprising a pinhole is formed over the focusing unit subsequent to the step of dicing the wafer.

10. The method as claimed in claim 9, wherein a top surface or a bottom surface or both the top and the bottom surfaces of the lens are curved surfaces.

11. The method as claimed in claim 9, wherein a top surface or a bottom surface of the lens is a flat surface.

12. The method as claimed in claim 9, wherein a plurality of micro lens is formed directly on the plurality of image sensing units.

13. The method as claimed in claim 9, wherein the lens unit is formed with a material comprising plastic or glass.

14. The method as claimed in claim 9, wherein the plurality of lens units are stacked together through an application of a glue in between the plurality of lens units or by performing a thermal setting process on the plurality of lens units.

15. The method as claimed in claim 9, wherein the light-shielding film is formed only outside of the sensing area.

* * * * *